United States Patent
Yoo

(10) Patent No.: US 7,518,938 B2
(45) Date of Patent: Apr. 14, 2009

(54) PRECHARGE CIRCUIT OF SEMICONDUCTOR MEMORY APPARATUS

(75) Inventor: Seong-Nyuh Yoo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 89 days.

(21) Appl. No.: 11/822,520

(22) Filed: Jul. 6, 2007

(65) Prior Publication Data
US 2008/0062791 A1    Mar. 13, 2008

(30) Foreign Application Priority Data
Sep. 13, 2006   (JP)   ............. 10-2006-0088751

(51) Int. Cl.
*G11C 7/12* (2006.01)
(52) U.S. Cl. .......... 365/203; 365/194
(58) Field of Classification Search ............ 365/204
See application file for complete search history.

(56) References Cited

U.S. PATENT DOCUMENTS

| | | | |
|---|---|---|---|
| 5,528,541 A * | 6/1996 | Ghia et al. | 365/203 |
| 5,671,186 A * | 9/1997 | Igura | 365/203 |
| 6,026,035 A | 2/2000 | Kim | |
| 6,141,275 A | 10/2000 | Tsai et al. | |
| 6,215,711 B1 * | 4/2001 | Kim | 365/193 |
| 6,298,003 B1 * | 10/2001 | Chou | 365/149 |
| 6,552,942 B2 | 4/2003 | Kim et al. | |

FOREIGN PATENT DOCUMENTS

| | | |
|---|---|---|
| JP | 11007770 | 1/1999 |
| JP | 2000-100186 | 4/2000 |
| KR | 1020000043193 | 7/2000 |
| KR | 1020010061426 | 7/2001 |
| KR | 1020030048677 | 6/2003 |
| KR | 1020040091980 | 11/2004 |
| KR | 100593149 | 6/2006 |

* cited by examiner

*Primary Examiner*—Tan T. Nguyen
(74) *Attorney, Agent, or Firm*—Venable LLP; Jeffri A. Kaminski

(57) ABSTRACT

A precharge circuit for a semiconductor memory apparatus includes a preliminary precharge signal generating unit that extracts read or write command including a precharge command to enable a preliminary precharge signal, and feedbacks the enabled preliminary precharge signal, to disable the preliminary precharge signal; and a precharge signal generating unit that outputs the preliminary precharge signal as a precharge signal, after the lapse of a delayed time corresponding to the read or write command.

21 Claims, 6 Drawing Sheets

PRECHARGE CIRCUIT OF SEMICONDUCTOR MEMORY APPARATUS

CROSS-REFERENCE TO RELATED PATENT APPLICATION

This application claims the benefit of Korean Patent Application No. 10-2006-0088751, filed on Sep. 13, 2006, in the Korean Intellectual Property Office, the disclosure of which is incorporated herein in its entirety by reference.

FIELD OF THE INVENTION

1. Technical Field

The present invention relates to a semiconductor memory apparatus, and in particular, to a precharge circuit for a semiconductor memory apparatus.

2. Related Art

Generally, a precharge command is included in a write or read command to be input to a semiconductor memory apparatus. Therefore, after completing the write or read operation, the semiconductor memory apparatus performs an operation that automatically sets a voltage level of a word line to a target level, which refers to a precharge operation. Further, a circuit required when the semiconductor memory apparatus performs the precharge operation is a precharge circuit.

As shown in FIG. 1, a conventional precharge circuit includes a first precharge signal generating unit 10 and a second precharge signal generating unit 20.

The first precharge signal generating unit 10 generates an extract signal EXTR using a column address strobe signal cas and a tenth address signal add10 as input signals. The extract signal EXTR is enabled at a high level when both the column address strobe signal cas and the tenth address signal add10 are at a high level at the same time. Further, if only the column address strobe signal cas is at a high level, the extract signal EXTR is disabled at a low level. The extract signal EXTR is disabled by feedback of a precharge signal APCG.

When the extract signal EXTR is at a high level, the first precharge signal generating unit 10 generates a preliminary precharge signal pre_APCG in response to a burst end signal BSTEND. That is, the burst end signal BSTEND that corresponds to an enable period of the extract signal EXTR is output as a preliminary precharge signal pre_APCG. In this case, the tenth address signal add10 is a signal that is enabled by a precharge command. Further, if both the tenth address signal add10 and the column address strobe signal cas are enabled, the precharge command becomes a command to precharge all of the banks. The burst end signal BSTEND is a signal that is enabled after lapse of the predetermined cycle of a clock that corresponds to a burst length when the write or the read command is input.

The second precharge signal generating unit 20 receives the preliminary precharge signal pre_APCG and generates a precharge signal APCG.

As shown in FIG. 2, three write commands WT0, WTA, WT1 are consecutively input. Among the commands, it is assumed that the second write command WTA is input together with the precharge command. The column address strobe signal cas is consecutively enabled three times, after the lapse of two clocks when the write command WT0 is input. In this case, between the first disable period and the second enable period of the column address strobe signal cas, the tenth address signal add10 is enabled. This is because the second write command WTA is input together with the precharge command.

Therefore, a mixed signal MIX is at a high level during a second enable period of column address strobe signal cas and an enable period of the tenth address signal add10. When the mixed signal MIX is at a high level, the mixed signal MIX is delayed by one clock, to be enabled as the extract signal EXTR. Because the delay time of the delay section DL1 shown in FIG. 1 is the same as one cycle of the clock CLK, the mixed signal MIX is enabled as the extract signal EXTR after one clock.

The extract signal EXTR that is enabled at a high level changes the preliminary precharge signal pre_APCG to a low level whenever the burst end signal BSTEND is at a low level. The low preliminary precharge signal pre_APCG is delayed by one cycle of the clock CLK and reversed to be output as the precharge signal APCG. Because the precharge operation is performed by the write command, the preliminary precharge signal pre_APCG is output by being delayed by one clock.

If the high precharge signal APCG is feedback to the preliminary precharge signal generating unit 10, the mixed signal MIX is changed to a low level. Accordingly, the extract signal EXTR is changed to a low level after one clock.

The preliminary precharge signal pre_APCG that is generated before the extract signal EXTR is changed to a low level is delayed by one clock to be output as the precharge signal APCG. As a result, the length of the enable period of the extract signal EXTR that is generated by the precharge command input together with the write command is two clocks. Accordingly, the preliminary precharge signal generating unit 10 outputs the two clocks of the burst end signal BSTEND as the preliminary precharge signal pre_APCG. Thus, the precharge signal APCG is also enabled two times.

However, in the typical precharge circuit, the precharge signal APCG should be generated by the second write command WTA among the three write commands WT0, WTA, and WT1. Referring to FIG. 2, the precharge signal APCG is also generated by the third write command WT1. Accordingly, the semiconductor memory apparatus performs an unnecessary precharge operation.

The unnecessary precharge operation occurs during an enable period of the extract signal EXTR. Moreover, the delay time of the delay section DL1 shown in FIG. 1 is varied depending on a voltage, a circumferential temperature, and the manufacturing processes. The change in delay time of the delay section DL1 deepens erroneous precharge operation.

SUMMARY

Embodiments provide a precharge circuit that is capable of preventing unnecessary precharge operation.

Further embodiments provide a precharge circuit that is not affected by a temperature, a manufacturing process, and a voltage.

According to an embodiment of a precharge circuit, a preliminary precharge signal generating unit extracts read or write commands including a precharge to enable a preliminary precharge signal, and feeds back the enabled preliminary precharge signal to disable the preliminary precharge signal; and a precharge signal generating unit that outputs the preliminary precharge signal as a precharge signal, after the lapse of a delay time corresponding to the read or write command.

DESCRIPTION OF EXEMPLARY EMBODIMENT

Hereinafter, a precharge circuit according to a preferred embodiment of this invention will be described with reference to the accompanying drawings.

Figure 1:
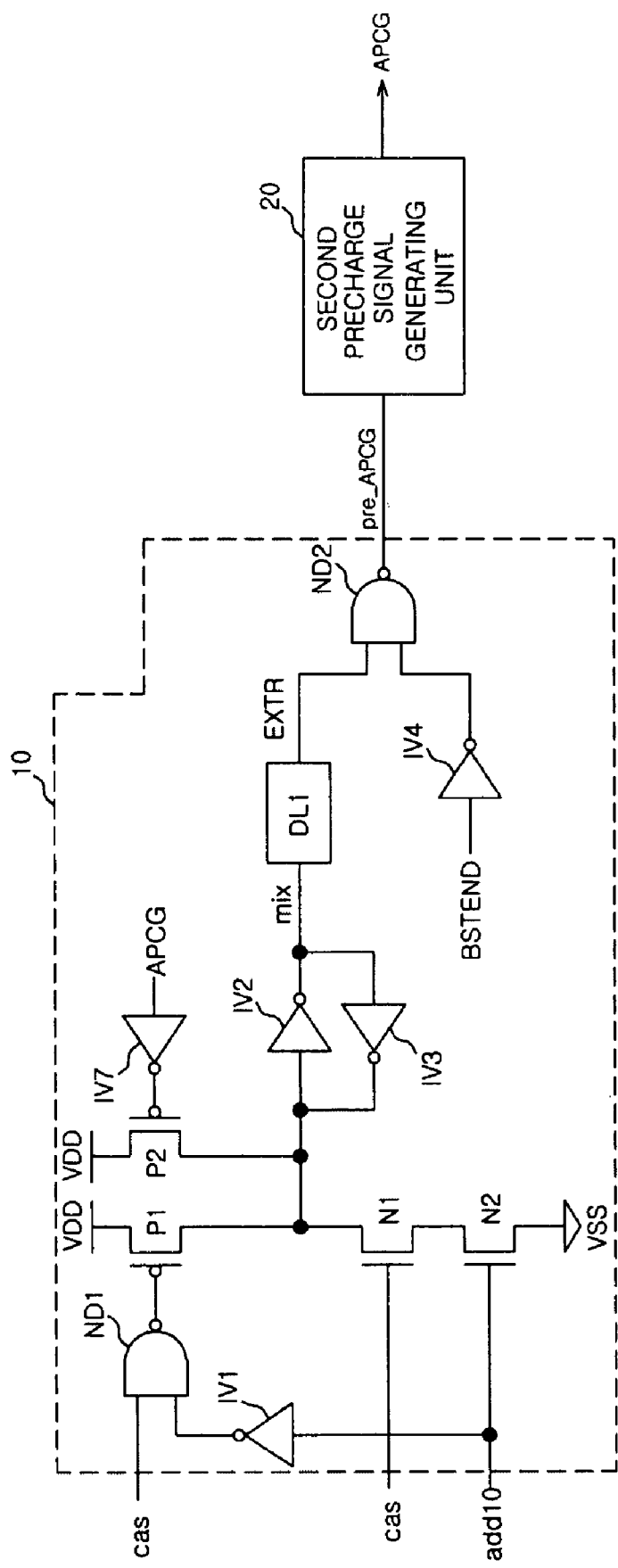
FIG. 1 is a circuit diagram of a conventional precharge circuit according to the related art.
Figure 2:
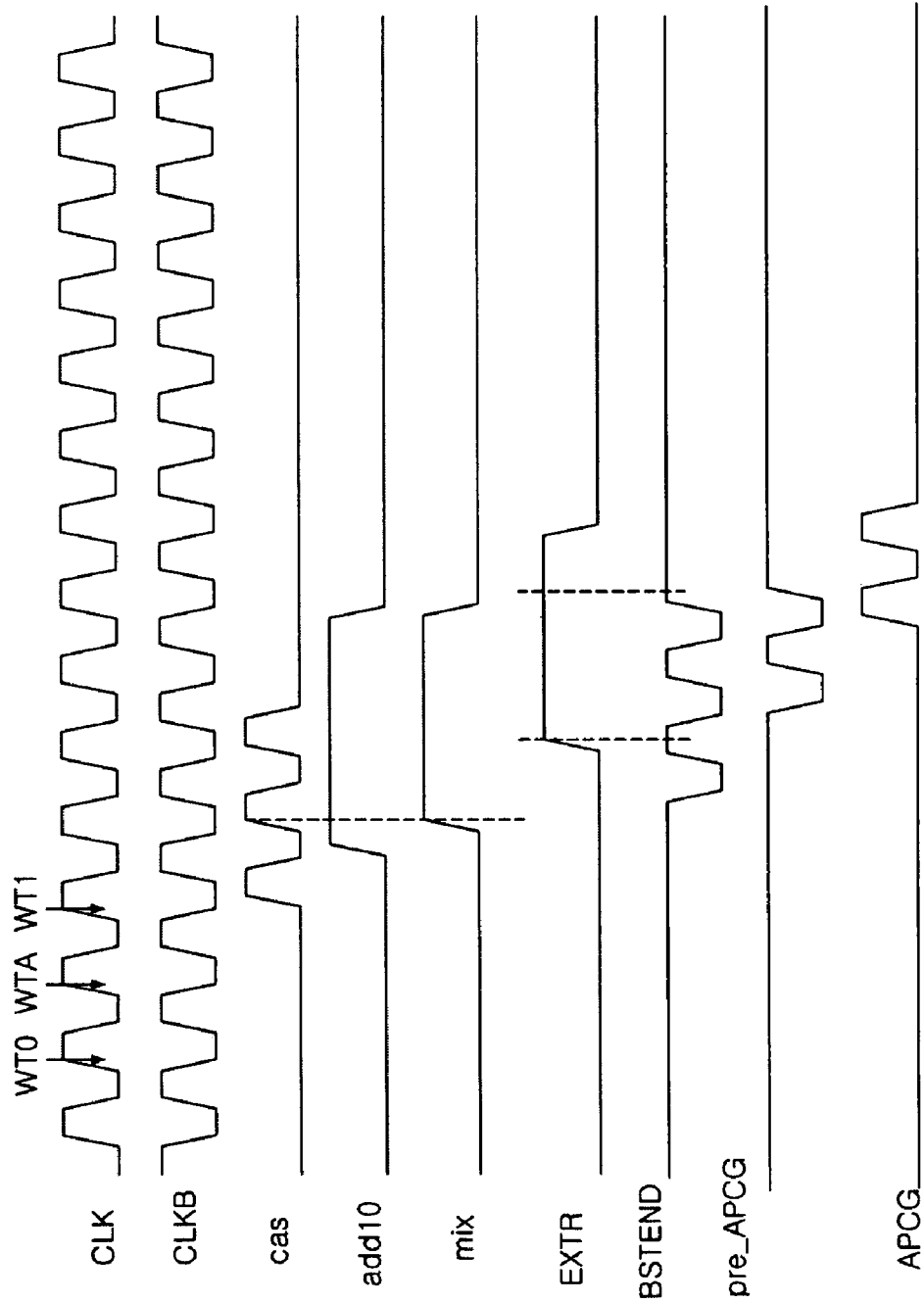
FIG. 2 is a timing chart of the conventional precharge circuit according to the related art.
Figure 3:
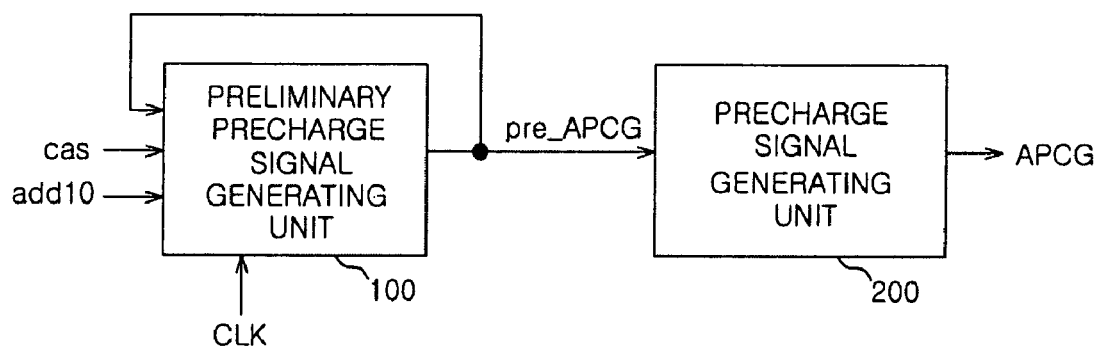
FIG. 3 is a block diagram of a precharge circuit according to an embodiment of the present invention.

Referring to FIG. 3, the precharge circuit according to the disclosed embodiment includes a preliminary precharge signal generating unit 100, and a precharge signal generating unit 200.

The preliminary precharge signal generating unit 100 extracts one command that includes a precharge command among a read command and a write command that are consecutively input by being synchronized with a clock CLK. The preliminary precharge signal generating unit 100 generates a preliminary precharge signal pre_APCG according to the extracted command.

The precharge signal generating unit 200 outputs the preliminary precharge signal pre_APCG as a precharge signal APCG, after the lapse of a delay time corresponding to the read or write command.

In this case, the preliminary precharge signal generating unit 100 receives a column address strobe signal cas and an address signal add10. The preliminary precharge signal pre_APCG output from the preliminary precharge signal generating unit 100 is fed back to the preliminary precharge signal generating unit 100.

Figure 4:
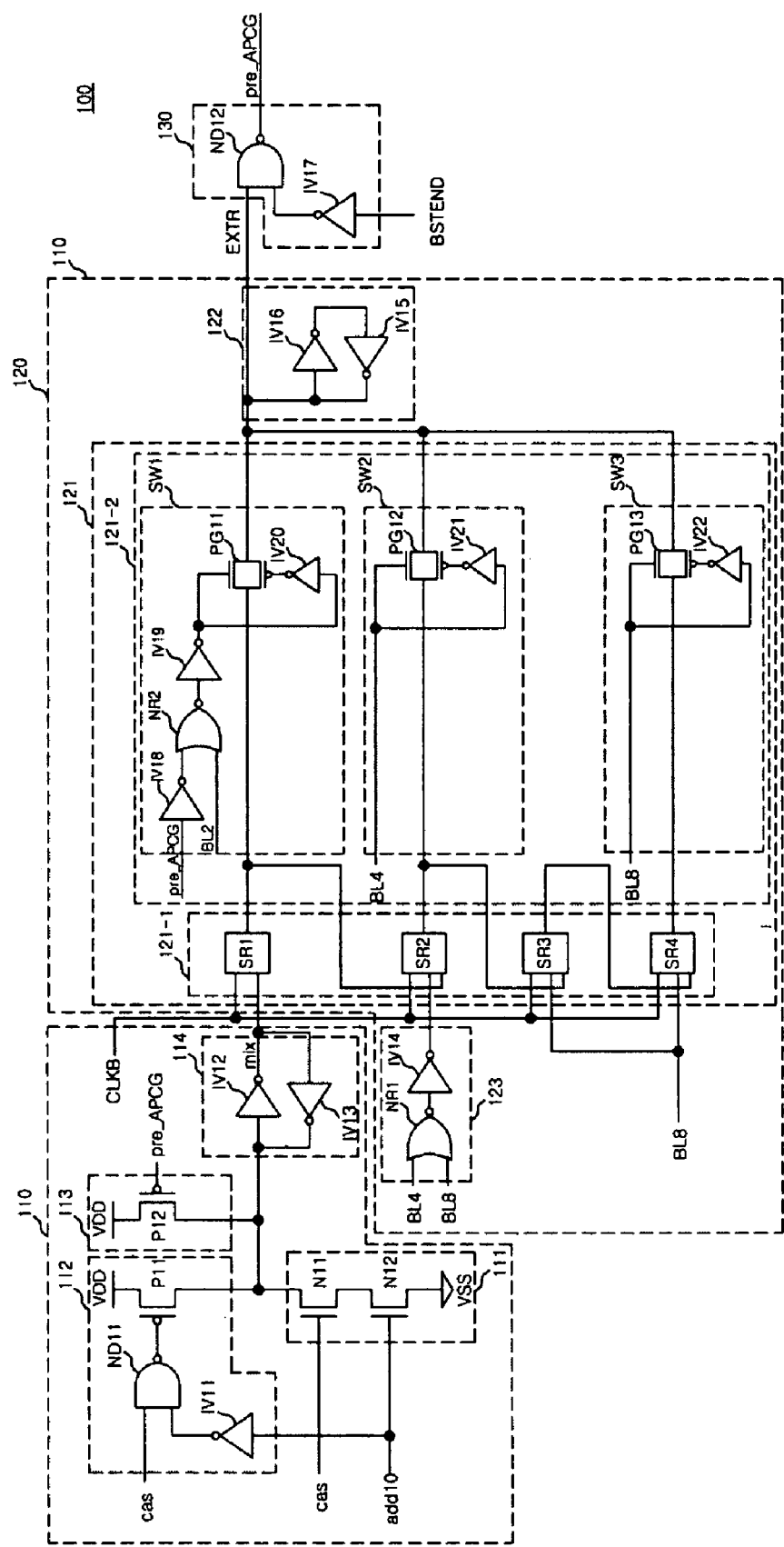
FIG. 4 is a circuit diagram of a preliminary precharge signal generating unit of FIG. 3.

Such a preliminary precharge signal generating unit 100 includes a signal mixer 110, an extract signal generator 120, and a preliminary signal generator 130, as shown in FIG. 4.

The signal mixer 110 generates a mixed signal mix to generate an extract signal EXTR in response to the read, write, and precharge commands, and the feedback preliminary precharge signal pre_APCG.

Specifically, if the read or write command includes the precharge command, the signal mixer 110 allows the mixed signal mix to be enabled. In the meantime, if only the read or write command is input or the preliminary precharge signal pre_APCG is enabled, the mixed signal mix is disabled.

Such a signal mixer 110 includes an enable section 111, a first disable section 112, a second disable section 113, and a first latch 114.

If the precharge command is input to the enable section 111, the mixed signal mix is enabled.

If both the column address strobe signal cas and the address signal add10 are enabled, the enable section 111 allows the extract signal EXTR to be enabled.

The enable section 111 include a first transistor N12 and a second transistor N11. The first transistor N12 includes a gate to which the address signal add10 is input, and a source connected to a ground terminal VSS. The second transistor N11 includes a gate to which the column address strobe signal cas is input, a source connected to a drain of the first transistor N12, and a drain that serves as an output terminal of the enable section 111.

If only the read or write command is input to the first disable section 112, the mixed signal mix is disabled.

As a result, the column address strobe signal cas and the address signal add10 are input, and if only the column address strobe signal cas is enabled, the first disable section 112 allows the extract signal EXTR to be disabled.

Such a first disable section 112 includes a first NAND gate ND11, inverter IV11 and a third transistor P11. The inverter IV11 receives the address signal add10. The first NAND gate ND11 receives the column address strobe signal cas and a output signal of the inverter IV11. The third transistor P11 includes a gate to which an output signal of the first NAND gate ND11 is input, a source to which an external power supply VDD is applied, and a drain that serves as an output terminal of the first disable section 112.

If the preliminary precharge signal pre_APCG is disabled, the second disable section 113 allows the mixed signal mix to be disabled.

As a result, when the preliminary precharge signal pre_APCG is disabled, the second disable section 113 allows the extract signal EXTR to be disabled.

The second disable section 113 includes a fourth transistor P12. The fourth transistor P12 includes a gate to which the preliminary precharge signal pre_APCG is input, a source to which an external power supply VDD is applied, and a drain that serves as an output terminal of the second disable section 113.

The first latch 114 maintains and inverts the levels of output signals of the enable section 111, the first disable section 112, and the second disable section 113 to output as the mixed signal mix. The output terminals of the enable section 111, the first disable section 112, and the second disable section 113 are commonly connected to an input terminal of the first latch 114, and an output terminal of the first latch 114 also serves as an output terminal of the signal mixer 110.

The output terminals of the enable section 111, the first disable section 112, and the second disable section 113 are commonly connected to the input terminal of the first latch 114, and the mixed signal mix is output through the output terminal of the first latch 114.

The extract signal generator 120 delays the enable timing of the mixed signal mix corresponding to burst lengths BL2, BL4, and BL8 to generate the extract signal EXTR. The enable time of the extract signal EXTR may be equal to one cycle of the clock CLK.

The extract signal generator 120 includes a delay time determining section 121, and a second latch 122. The delay time determining section 121 delays the mixed signal mix a period of clock CLK that corresponds to the burst lengths BL2, BL4, and BL8. The second latch 122 maintains the level of the output signal of the delay time determining section 121 and outputs as the extract signal EXTR.

The delay time determining section 121 includes a delay section 121-1 that delays the mixed signal mix by the period of the clock CLK and a selector 121-2 that selectively provides output signals of the delay section 121-1 corresponding to the burst lengths BL2, BL4, and BL8.

The delay section 121-1 is a circuit that delays an input signal that is, the mixed signal mix by the period of the clock CLK, for example, and is configured by first to fourth shift registers SR1 to SR4 connected in series to each other. In this case, the first to fourth shift registers SR1 to SR4 may be formed by flip-flops.

The delay section 121-1 includes a first shift register SR1 to which the mixed signal mix and an inverted clock CLKB are input, a second register SR2 to which an output signal of the first register SR1 and the inverted clock CLKB are input, a third shift register SR3 to which an output signal of the second shift register SR2 and the inverted clock CLKB is input, and a fourth shift register SR4 to which an output signal of the third shift register SR3 and the inverted clock CLKB is input. If a fourth burst length BL4 or an eighth burst length BL8 is enabled, the delay section 121-1 may further include a connector 123 that operates the shift registers SR2 to SR4.

The connector 123 performs a NOR operation on the fourth burst length BL4 and the eighth burst length BL8, and inverts the value obtained by the NOR operation for input to the second shift register SR2. The eighth burst length BL8 is input to the third and fourth shift registers SR3 and SR4.

The selector 121-2 includes a plurality of switches, for example first to third switches SW1, SW2, and SW3 for producing the output signals of the delay section 121-1 corresponding to the burst lengths BL2, BL4, and BL8.

The first switch SW1 turns-on in response to the shortest burst length BL2 among the burst lengths BL2, BL4, and BL8. The first switch SW1 is provided to make the enable period of the extract signal EXTR one cycle of the clock CKL. More specifically, the first switch SW1 is turned on when the shortest burst length signal BL2 or the preliminary precharge signal pre_APCG is enabled. In this case, the first switch SW1 that is turned on provides the output signal of the first shift register SR1.

The first switch SW1 includes a first inverter IV18, a NOR gate NR2, a second inverter IV19, a inverter IV20, and a pass gate PG11. The first inverter IV18 receives the preliminary precharge signal pre_APCG. The NOR gate NR2 receives the shortest burst length signal BL2 and an output signal of the first inverter IV18. The second inverter IV19 receives an output signal of the NOR gate NR2. The inverter IV20 receives an output signal of the second inverter IV19. The pass gate PG11 receives an output signal of the second inverter IV19 and the inverter IV20. It is determined whether the first switch SW1 is turned on or off in accordance with the level of the output signal of the second inverter IV19.

The second switch SW2 is turned on when the burst length signal BL4 is enabled.

The second switch SW2 includes a pass gate PG12, and an inverter IV21. The inverter IV21 receives the burst length signal BL4. The pass gate PG12 receives the burst length signal BL4 and an output signal of the inverter IV20. The pass gate PG12 is turned on in response to the fourth burst length BL4. In this case, the second switch SW2 that is turned on outputs an output signal of the second shift register SR2.

The third switch SW3 is turned on when the burst length signal BL8 is enabled. The third switch SW3 includes a pass gate PG13, and an inverter IV22. The inverter IV22 receives the burst length signal BL8. The pass gate PG13 receives the burst length signal BL8 and an output signal of the inverter IV21. The pass gate PG13 is turned on in response to the eighth burst length BL8. In this case, the third switch SW3 that is turned on outputs an output signal of the fourth shift register SR4.

The second latch 122 includes a third inverter IV16 and a fourth inverter IV15. The third inverter IV16 receives an output signal of the delay time determining unit 122. The fourth inverter IV15 receives an output signal of the third inverter IV16 for output to the third inverter IV16. Therefore, the second latch 122 maintains the level of the output signal of the extract signal generator 120. The preliminary precharge signal generator 130 outputs the burst end signal BSTEND as the preliminary precharge signal pre_APCG during the enable period of the extract signal EXTR.

The preliminary precharge signal generator 130 includes an inverter IV17 and a NAND gate ND12. The inverter IV17 receives the burst end signal BSTEND. The NAND gate ND12 receives the output signal of the inverter IV17 and the extract signal EXTR. Accordingly, the NAND gate ND12 outputs the burst end signal BSTEND as the preliminary precharge signal pre_APCG during an enable period of the extract signal EXTR.

Figure 5:
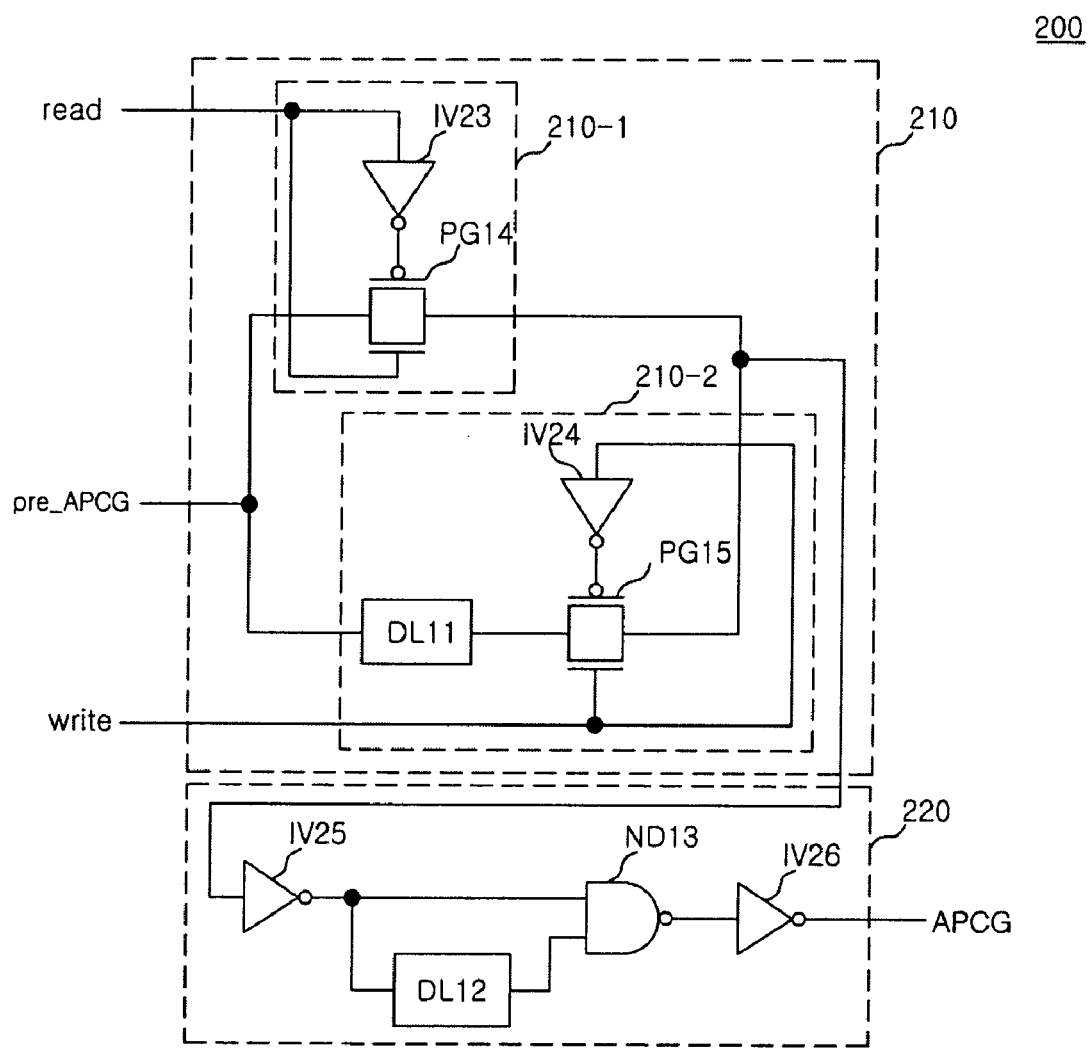
FIG. 5 is a circuit diagram of a precharge signal generating unit of FIG. 3.

As shown in FIG. 5, the precharge signal generating unit 200 includes a selecting portion 210 and a signal generator 220.

The selecting portion 210 selectively delays the preliminary precharge signal pre_APCG in response to the read or write command.

The selecting portion 210 includes a read selector 210-1 and a write selector 210-2. In this case, an output terminal of the selecting portion 210 is a node to which output terminals of the read selector 210-1 and the write selector 210-2 are connected.

The read selector 210-1 outputs the preliminary precharge signal pre_APCG in response to the read command.

The read selector 210-1 includes a fifth inverter IV23 and a pass gate PG14. The fifth inverter IV23 receives a read signal read. The pass gate PG14 outputs the preliminary precharge pre_APCG according to an output signal of the fifth inverter IV23 and the read signal read.

The write selector 210-2 delays and outputs the preliminary precharge signal pre_APCG in response to the write command.

The write selector 210-2 includes a sixth inverter IV24, a delay section DL11, and a pass gate PG15. The sixth inverter IV24 receives a write signal write. The delay section DL11 receives a preliminary precharge signal pre_APCG. The pass gate PG15 provides an output signal of the delay section DL11 on the basis of an output signal of the sixth inverter IV24 and the write signal write.

The signal generator 220 receives an output signal of the selecting portion 210 to generate the precharge signal APCG.

The signal generator 220 includes a seventh inverter IV25, an eighth inverter IV26, a delay section DL12, and a NAND gate ND13. The seventh inverter IV25 receives the output signal of the selecting portion 210. The delay section DL12 receives an output signal of the seventh inverter IV25. The NAND gate ND13 receives output signals of the seventh inverter IV25 and the delay section DL12. The eighth inverter IV26 inverts an output signal of the NAND gate ND13 to be output as the precharge signal APCG.

The operation of the precharge circuit for a semiconductor memory apparatus configured as described above will be described.

Figure 6:
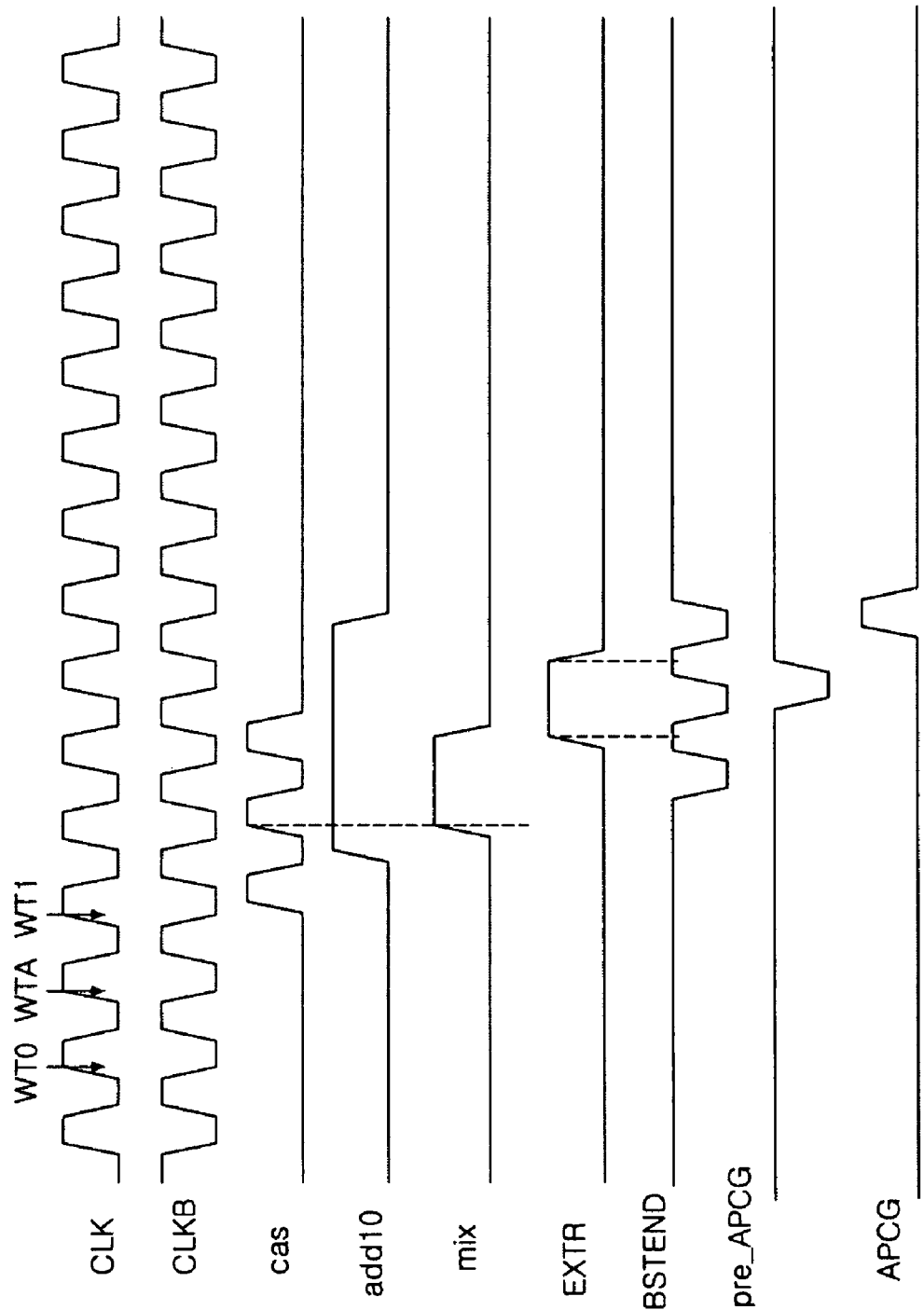
FIG. 6 is a timing chart of the precharge circuit according to the embodiment of the present invention.

FIG. 6 is a timing chart of the precharge circuit according to an embodiment of the present invention, and shows a result when the write commands WT0, WTA, and WT1 are synchronized with a clock CLK and consecutively input, and the burst length is 2. In this case, the second write command WTA is input together with the precharge command.

A column address strobe signal cas is a signal that is changed to a high level consecutively three times from a timing when the clock CLK is changed to a second high level after the first write command WT0 is input. In this case, the cycle of the column address strobe signal cas is the same as the clock CLK.

The tenth address signal add10 is enabled to a high level at a timing when the clock CLK is changed to a second high level after the second write command WTA is input and then is disabled to a low level after a predetermined time.

The enable section 111 of the preliminary precharge signal generating unit 100, outputs a low level signal during a period when the column address strobe signal cas is at a second high level and the tenth address add10 is at a high level. That is, the mixed signal mix becomes a high level. Further, the first latch 114 maintains a high level before the first disable section 112 or the second disable section 113 is enabled to allow the mixed signal mix to be disabled. In this case, since the burst length is 2, the mixed signal mix passes through only the first shift register SR1. Therefore, the mixed signal mix is delayed by one cycle period of the clock CLK and then input to the second latch 122. The second latch 122 maintains the level of the input signal thereof and outputs the same as an output signal, but does not invert the input signal.

Accordingly, the extract signal EXTR output from the second latch 122 becomes high level at a timing that is delayed compared to the mix signal mix by one period of the clock CLK.

The burst end signal BSTEND is a signal that is changed to a low level after the lapse of four clocks CLKs when the write command is input. In this case, the burst length is 2. Therefore, since FIG. 6 shows a case when the burst length is 2 and the three write commands WT0, WTA, and WT1 are consecutively input, the burst end signal BSTEND has a low level three times after the lapse of four clocks CLK when the first write command WT0 is input.

The preliminary precharge signal generator 130 outputs a preliminary precharge signal pre_APCG that is changed to a low level when the extract signal EXTR is a high level, and the burst end signal BSTEND is a low level. Meanwhile, the preliminary precharge signal pre_APCG that is changed to a low level is fed back and input to the second disable section 113. That is, the mixed signal mix is changed to a low level and is delayed by one clock to be input to a second latch 122. Accordingly, the extract signal EXTR is changed to a low level, and the enabled time of the extract signal EXTR is equal to one cycle of the clock CLK.

Further, the preliminary precharge signal generator 130 that receives the extract signal EXTR having a low level allows the preliminary precharge signal pre_APCG to be changed to a high level. As a result, the preliminary precharge signal pre_APCG is enabled to a low level one time and then disabled to a high level.

As a result, the preliminary precharge signal pre_APCG is enabled one time and then the precharge signal APCG is also enabled after the lapse of a predetermined time according to the read or write command. Therefore, the semiconductor memory apparatus that uses the precharge circuit according to an embodiment of the present invention perform a stable precharge operation.

Therefore, the precharge circuit for a semiconductor memory apparatus according to an embodiment of the invention performs one precharge operation if one precharge command is included in the read or write commands that are consecutively input, which improves the stability of the semiconductor memory apparatus.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A precharge circuit for a semiconductor memory apparatus, comprising:
a preliminary precharge signal generating unit that extracts read or write commands including a precharge command to enable a preliminary precharge signal, and feeds back to itself the enabled preliminary precharge signal, to disable the preliminary precharge signal; and
a precharge signal generating unit that outputs the preliminary precharge signal as a precharge signal, after the lapse of a delay time corresponding to the read or write command.

2. The precharge circuit for a semiconductor memory apparatus of claim 1,
wherein the preliminary precharge signal generating unit includes:
a signal mixer that generates a mixed signal according to the preliminary precharge signal in response to the read, write, and precharge commands,
an extract signal generator that delays an enable timing of the mixed signal corresponding to burst lengths to generate an extract signal, wherein an enable period of the extract signal is equal to one cycle of the clock; and
a preliminary precharge signal generator that outputs a burst end signal as the preliminary precharge signal during the enable period of the extract signal.

3. The precharge circuit for a semiconductor memory apparatus of claim 2,
wherein if the read or write command includes the precharge command, the signal mixer allows the mixed signal to be enabled,
and if only the read or write command is input or the preliminary precharge signal is enabled, the signal mixer allows the mixed signal to be disabled.

4. The precharge circuit for a semiconductor memory apparatus of claim 3,
wherein the signal mixer includes:
an enable section that allows the mixed signal to be enabled if the precharge command is input;
a first disable section that allows the mixed signal to be disabled if only the read or write command is input,
a second disable section that allows the mixed signal to be disabled if the preliminary precharge signal is enabled; and
a latch that maintains and inverts levels of output signals of the enable section, the first disable section, and the second disable section for output as the mixed signal.

5. The precharge circuit for a semiconductor memory apparatus of claim 4,
wherein the enable section receives a column address strobe signal that is enabled by the read, write and precharge commands and an address signal that is enabled by the precharge command, and if the column address strobe signal and the address signal are enabled, the enable section allows the mixed signal to be enabled.

6. The precharge circuit for a semiconductor memory apparatus of claim 5,
wherein the enable section includes:
a first transistor having a drain, a gate to which the address signal is input and a source connected to a ground terminal; and
a second transistor having a gate to which the column address strobe signal is input, a source connected to the drain of the first transistor, and a drain that serves as an output terminal of the enable section.

7. The precharge circuit for a semiconductor memory apparatus of claim 5,
wherein the first disable section receives the column address strobe signal that is enabled by the read, write and precharge commands and the address signal that is enabled by the precharge command, and if only the column address strobe signal is enabled, the first disable section allows the mixed signal to be enabled.

8. The precharge circuit for a semiconductor memory apparatus of claim 7,
wherein the first disable section includes:
a NAND gate to which the column address strobe signal and an inverted address signal are input and providing an output signal; and
a transistor having a gate to which the output signal of the NAND gate is input, a source to which an external power supply is applied, and a drain that serves as an output terminal of the first disable section.

9. The precharge circuit for a semiconductor memory apparatus of claim 4,
wherein if the preliminary precharge signal is disabled, the second disable section allows the mixed signal to be disabled.

10. The precharge circuit for a semiconductor memory apparatus of claim 9,
wherein the second disable section includes a transistor having a gate to which the preliminary precharge signal is input, a source to which an external power supply is applied, and a drain that serves as output terminal of the second disable section.

11. The precharge circuit for a semiconductor memory apparatus of claim 2,
wherein the extract signal generator includes:
a delay time determining section that delays the mixed signal by the clock that corresponds to the burst lengths to provide an output signal; and
a latch that maintains a level of the output signal of the delay time determining section.

12. The precharge circuit for a semiconductor memory apparatus of claim 11,
wherein the delay time determining section includes:
a delay section that delays the mixed signal by the clock; and
a selector that selectively outputs the output signals of the delay section corresponding to the burst lengths.

13. The precharge circuit for a semiconductor memory apparatus of claim 12,
wherein the delay section includes a plurality of shift registers that are connected in series, wherein each shift register delays an input signal theirof in response to the clock.

14. The precharge circuit for a semiconductor memory apparatus of claim 13,
wherein the shift registers includes flip-flops.

15. The precharge circuit for a semiconductor memory apparatus of claim 13,
wherein the extract signal generator further includes:
a connector that selectively operates any of the shift registers of the delay time determining section that corresponds to the burst length.

16. The precharge circuit for a semiconductor memory apparatus of claim 12,
wherein the selector includes a plurality of switches that output the output signals of the delay section corresponding to the burst lengths.

17. The precharge circuit for a semiconductor memory apparatus of claim 16,
the plurality of switches includes a first switch that corresponds to a shortest burst length among the burst lengths, and the first switch makes the enable period of the extract signal as one cycle of the clock.

18. The precharge circuit for a semiconductor memory apparatus of claim 17,
wherein the first switch is turned on when the shortest burst length signal or the preliminary precharge signal is enabled.

19. The precharge circuit for a semiconductor memory apparatus of claim 18,
wherein the first switch includes:
a first inverter receiving the preliminary precharge signal as input and providing an output signal;
a NOR gate receiving the shortest burst length signal and the output signal of the first inverter as input and providing an output signal; and
a second inverter that receives that the output signal of the NOR gate as an input signal and provides an output signal, and wherein
the first switch is turned on or off on the basis of the output signal of the second inverter.

20. The precharge circuit for a semiconductor memory apparatus of claim 17,
wherein each of the plurality of switches includes a pass gate corresponding to the burst length.

21. The precharge circuit for a semiconductor memory apparatus of claim 2,
wherein the preliminary precharge signal generator inputs an inverted burst end signal and the extract signal to generate the preliminary precharge signal.

* * * * *